United States Patent
Wu

(10) Patent No.: US 7,952,142 B2
(45) Date of Patent: May 31, 2011

(54) VARIABLE WIDTH OFFSET SPACERS FOR MIXED SIGNAL AND SYSTEM ON CHIP DEVICES

(75) Inventor: Shien-Yang Wu, Hsinchu (TW)

(73) Assignee: Taiwan Semiconductor Manufacturing Co., Ltd., Hsin-chu (TW)

(*) Notice: Subject to any disclaimer, the term of this patent is extended or adjusted under 35 U.S.C. 154(b) by 312 days.

(21) Appl. No.: 12/253,755

(22) Filed: Oct. 17, 2008

(65) Prior Publication Data

US 2009/0039445 A1     Feb. 12, 2009

Related U.S. Application Data

(62) Division of application No. 11/592,291, filed on Nov. 3, 2006, now Pat. No. 7,456,066.

(51) Int. Cl.
*H01L 27/088* (2006.01)

(52) U.S. Cl. .................. 257/336; 257/E27.088
(58) Field of Classification Search .................. 257/336, 257/408, E27.088
See application file for complete search history.

(56) References Cited

U.S. PATENT DOCUMENTS

| | | | | |
|---|---|---|---|---|
| 5,021,354 A | * | 6/1991 | Pfiester | 438/230 |
| 2005/0051866 A1 | * | 3/2005 | Wang et al. | 257/510 |
| 2007/0114605 A1 | | 5/2007 | Dyer et al. | |
| 2008/0003746 A1 | * | 1/2008 | Curello et al. | 438/258 |

OTHER PUBLICATIONS

Suzhou University Press, "Semiconductor Devices Physics and Technology," $2^{nd}$ Edition, Published Aug. 31, 2004, pp. 360-366.

* cited by examiner

*Primary Examiner* — Thomas L Dickey
(74) *Attorney, Agent, or Firm* — Birch, Stewart, Kolasch & Birch, LLP

(57) ABSTRACT

MOSFET gate structures comprising multiple width offset spacers are provided. A first and a second gate structure are formed on a semiconductor substrate. A pair of first offset spacers are formed adjacent either side of the first gate structure. Each of the first offset spacers comprises a first silicon oxide layer with a first dielectric layer overlying. A pair of second offset spacers are formed adjacent either side of the second gate structure. Each of the second offset spacers comprises a second silicon oxide layer with a second dielectric layer overlying. Ion implanted doped regions are formed in the semiconductor substrate adjacent the first and second offset spacers respectively to form a first and second MOSFET device. A maximum width of each of the first offset spacers is different from that of the second offset spacers. The first silicon oxide layer is thinner than the second silicon oxide layer.

11 Claims, 4 Drawing Sheets

US 7,952,142 B2

VARIABLE WIDTH OFFSET SPACERS FOR MIXED SIGNAL AND SYSTEM ON CHIP DEVICES

This application is a Divisional of application Ser. No. 11/592,291, filed on Nov. 3, 2006 now U. S. Pat. No. 7,456,066 and for which priority is claimed under 35 U.S.C. § 120, the entire contents of which are hereby incorporated by reference.

FIELD OF INVENTION

This invention generally relates to processes for forming semiconductor device integrated circuits including CMOS and MOSFET devices and more particularly to mixed signal devices (i.e., analog and digital) and a method for forming the same to simultaneously optimize offset spacer widths to improve performance of both analog and digital CMOS devices including system on chip (SOC) devices.

BACKGROUND OF THE INVENTION

With increasing demands for embedded memory type structures, mixed-signal circuits, and system on chip (SOC) IC design, it has become necessary to form multiple transistor structures on a single die to achieve integrated functioning of the different transistor structures. For example, transistors with different structures and functions typically operate under different current and voltage parameters requiring different LDD widths and depths for the various transistors.

As MOSFET device characteristic sizes are scaled down below 0.25 microns, including below 0.1 micron, device designs must be modified for each generation of device scaling. For example, short channel effects (SCE) are one of the most important challenges for designers to overcome as device critical dimensions are scaled down. Among the many manifestations of SCE, are Voltage threshold ($V_T$) rolloff, drain induced barrier lowering (DIBL), and subthreshold swing variation.

In addition, there is an increasing demand for integrating mixed signal (i.e., digital/analog) functions on a single chip, e.g., system on chip (SOC devices, thereby requiring the formation of different types of transistors. Problematically, transistors for analog circuits have significantly different operating and processing requirements compared to transistors for digital or logic circuits.

Digital CMOS transistors are primarily concerned with increasing drive current while reducing short channel effects (SCE), thereby requiring relatively high implant doses in pocket implants to improve device operation. On the other hand, analog CMOS devices are degraded by such processing approaches including transistor Voltage threshold ($V_T$) matching and Voltage gain characteristics.

Methods for dealing with the different processing requirements in forming different types of transistors (i.e. analog and digital) on a single chip, e.g., SOC devices, have focused on separate processes carried out for each type of transistor. Such prior art approaches lead to higher costs and process incompatibility which detrimentally impacts the performance and reliability of both transistor types.

There is therefore a need in the semiconductor device integrated circuit manufacturing art for an improved mixed signal device and method for forming the same such that digital and analog CMOS devices may be more effectively individually optimized for performance and reliability in parallel production processes, including forming system on chip (SOC) devices.

It is therefore an object of the present invention to provide an improved mixed signal device and methods for forming the same such that digital and analog CMOS devices may be more effectively individually optimized for performance and reliability in parallel production processes, including forming system on chip (SOC) devices, as well as overcoming other shortcomings of the prior art.

SUMMARY OF THE INVENTION

To achieve the foregoing and other objects, and in accordance with the purposes of the present invention, as embodied and broadly described herein, the present invention provides MOSFET gate structures including respective multiple width offset spacers and a method of forming the same.

In a first embodiment, the method includes providing a semiconductor substrate including at least two gate structures; growing a silicon oxide layer having a respective differential thickness over the at least two gate structures; forming a dielectric layer on the silicon oxide layer having an etching selectivity with respect to the silicon oxide layer; forming offset spacers having a differential thickness including the dielectric layer and the silicon oxide layer adjacent either side of the at least two respective gate structures; and, carrying out an ion implant process adjacent the offset spacers to form doped regions in the semiconductor substrate forming at least two MOSFET devices.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to exemplary CMOS transistors (i.e., MOSFET) devices, it will be appreciated that the present invention may be applied to various CMOS devices where MOSFET transistors having operationally distinguishable characteristics are formed on a single chip, e.g., in a system on chip (SOC) implementation to achieve individually optimized performance of transistors in a parallel manufacturing process.

Figure 1A:
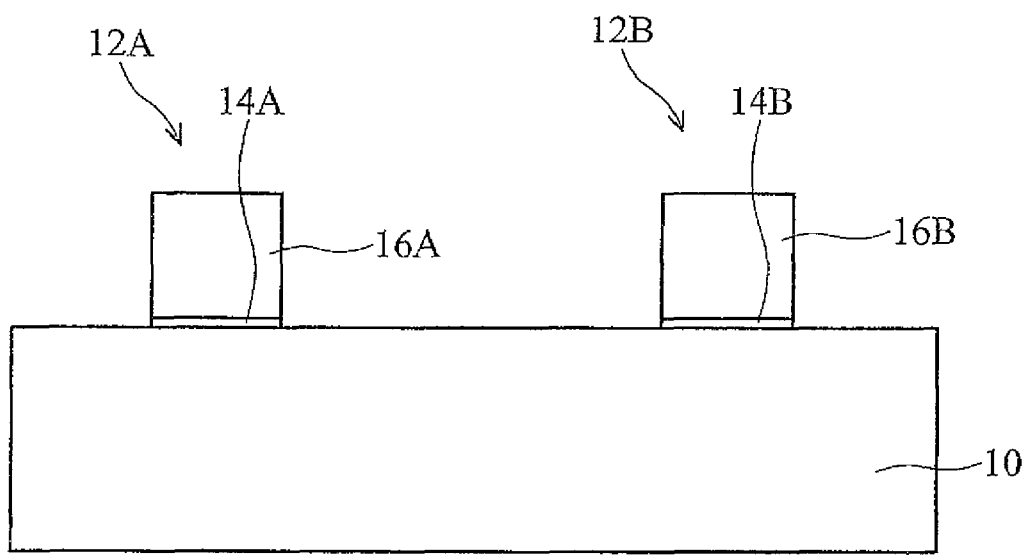
FIGS. 1A-1E are cross sectional views of a process wafer including a portion of an exemplary MOSFET gate structure at manufacturing stages according to an embodiment of the present invention.

Referring to FIG. 1A, in an exemplary implementation of the present invention, is shown a semiconductor substrate 10 having overlying gate structures 12A and 12B including respective gate dielectric portions 14A and 14B and respective overlying gate electrode portions 16A and 16B. Gate dielectric portions and overlying gate electrode portions of gate structures 12A and 12B may be formed by conventional deposition, lithographic and etching processes. The semiconductor substrate 10, may include, but is not limited to, silicon, silicon on insulator (SOI) stacked SOI (SSOI), stacked SiGe on insulator (S—SiGeOI), SiGeOI, and GeOI, or combinations thereof. It will be appreciated that an electrical isolation structure such as a shallow trench isolation (STI) structure (not shown) may be provided between gate structures 12A and 12B to isolate the respective MOSFET devices.

Still referring to FIG. 1A, the gate structures 12A and 12B may be formed by conventional CVD deposition, lithographic patterning, and plasma (dry) etching methods known in the art. The gate dielectric portions 14A and 14B may be formed by any process known in the art, e.g., thermal oxidation, nitridation, sputter deposition, chemical vapor deposition, or combinations thereof. The gate dielectric portions 14A and 14B may be formed of silicon oxide, silicon nitride, silicon oxynitride, and high-K dielectrics (e.g., K>8) including transition metal oxide and rare earth metal oxides. For example, high-K dielectrics may be formed of aluminum oxides (e.g., $Al_2O_3$), hafnium oxides (e.g., $HfO_2$), hafnium oxynitrides (HfON), hafnium silicates (e.g. $HfSiO_4$), hafnium silicon oxynitrides (e.g., $HfSi_xO_yN_z$), zirconium oxides (e.g., $ZrO_2$), zirconium oxynitrides (e.g., ZrON), zirconium silicon oxides (e.g., $ZrSiO_2$), yttrium oxides ($Y_2O_3$), lanthanum oxides ($La_2O_3$), cerium oxides ($CeO_2$), titanium oxides ($TiO_2$), tantalum oxides ($Ta_2O_5$), or combinations thereof. The high-k dielectric layer may be formed by known CVD methods such as atomic layer CVD (ALCVD) and metal-organic CVD (MOCVD). It will be appreciated that the high-K dielectric layer may include a lowermost interfacial layer formed on the semiconductor substrate such as an oxide or oxynitride (not shown).

The gate electrode portions, 16A and 16B may be formed of poly gate such as polysilicon, amorphous polysilicon, doped polysilicon, polysilicon-germanium, or metal gate such as TaC, TaN, TiN, MoN or combinations thereof). For example, a gate dielectric layer is first formed by CVD, sputtering or thermal growth processes followed by deposition of an overlying gate electrode material and an optional hardmask layer (not shown). Conventional lithographic patterning and dry etching processes are then carried out to form the gate structures 12A and 12B.

Figure 1B:
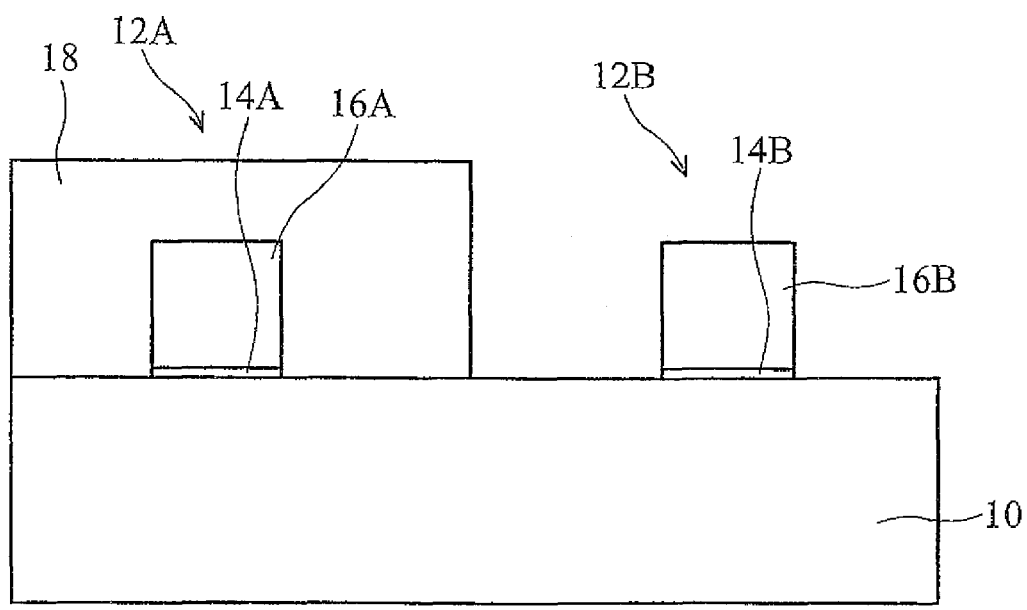

Referring to FIG. 1B, a patterned photoresist layer 18 is then formed to cover selected gate structures. For example, in the dual device gate structure formation process shown, gate structure 12A is covered while leaving gate structure 12B uncovered. Following formation of patterned photoresist layer 18, in an important aspect of the invention, an ion implantation process is carried out to ion implant uncovered gate structure 12B and adjacent substrate areas with one of a thermal oxidation rate enhancing or thermal oxidation rate suppressing ion implant. For example, in the embodiment as shown, fluorine ions (e.g., F-) are used in the ion implant process to enhance a subsequent thermal oxidation rate in growing a thermal oxide ($SiO_2$) over the gate structures 12A and 12B as well as adjacent substrate areas. Alternatively, a thermal oxidation rate suppressing ion implant such as a nitrogen (e.g., N-) implant may be used to suppress a subsequent thermal oxidation rate and thereby a subsequent $SiO_2$ thermal oxide thickness is reduced.

Figure 1C:
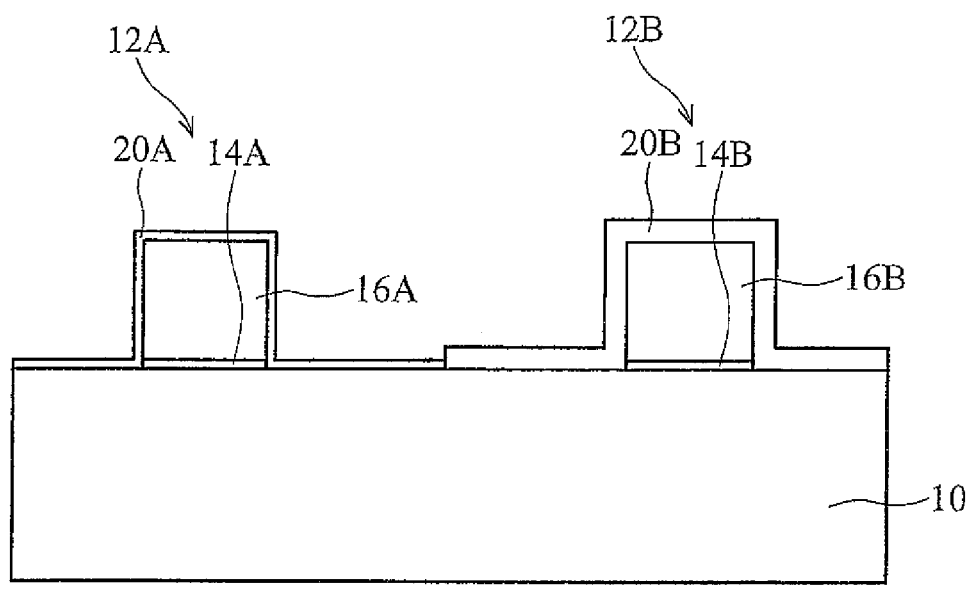

Referring to FIG. 1C, following the ion implant process and stripping of the patterned photoresist layer 18, a conventional thermal oxide growth process is carried out, for example, a wet or dry oxidation process at temperatures of about 900° C. to about 1050° C., to grow a silicon oxide ($SiO_2$) layer over gate structures 12A and 12B as well as adjacent substrate 10 portions. In an important aspect of the invention, the $SiO_2$ layer formed over the gate structures are formed to have a differential thickness. For example, in the embodiment shown, $SiO_2$ layer portion 20B, grown over the area subjected to the fluorine ion implant including gate structure 12B, is formed have a relatively greater thickness compared to $SiO_2$ layer portion 20A grown over the photoresist covered area including gate structure 12A. The differential thickness is advantageously formed as a result of the oxide growth rate enhancing fluorine ion implantation over the gate structure 12B and adjacent substrate portions.

It will be appreciated that an oxide growth suppressing ion implant may be used to form the differentially thick $SiO_2$ thermal oxide layer. For example, a nitrogen ion implant may be carried out over gate structure 12A while covering gate structure 12B with photoresist such that the similar differentially thick $SiO_2$ layer portions 20A and 20B will be formed. It will also be appreciated that a greater differential thickness between oxide layer portions e.g., 20A and 20B may be formed by carrying out both an oxide growth enhancing implant over one gate structure e.g., 12B as well as an oxide growth suppressing implant over another gate structure e.g., 12A. Preferably, the relatively thinner oxide layer portion e.g., 20A is formed at a thickness between about 10 Angstroms to about 50 Angstroms and the relatively thicker oxide layer portion e.g., 20B is formed at a thickness between about 20 Angstroms to 80 Angstroms.

Figure 1D:
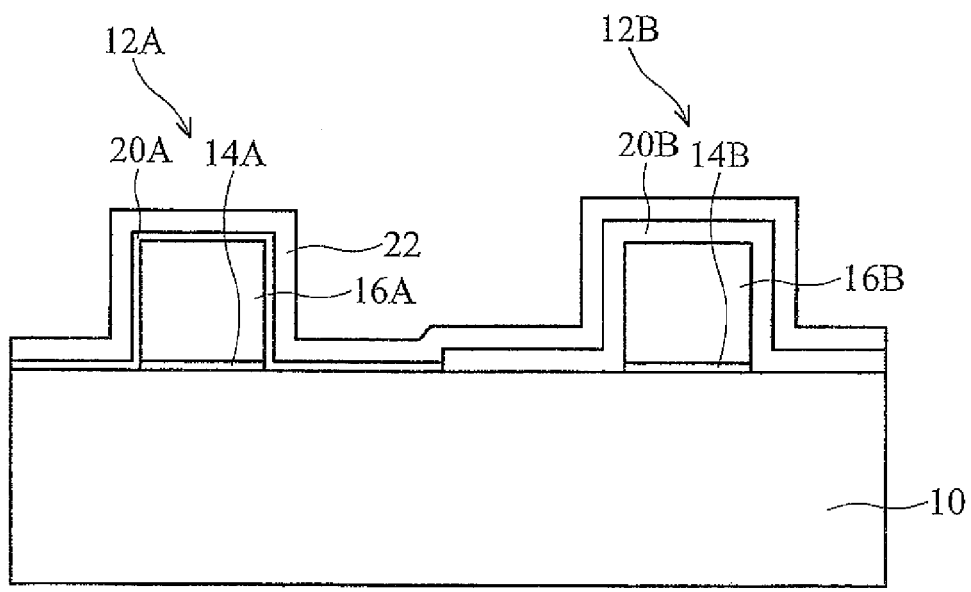

Referring to FIG. 1D a dielectric layer 22 is blanket deposited, e.g., by CVD or PECVD over the oxide layers 20A and 20B. The dielectric layer 22 preferably has an etching selectivity with respect to the underlying thermal oxide layer portions e.g., 20A and 20B, for example, formed of a nitride material such as silicon nitride (e.g., SiN) and/or silicon oxynitride (e.g., SiON). The dielectric layer 22 is preferably deposited having a thickness range of about 20 Angstroms to about 80 Angstroms.

Figure 1E:
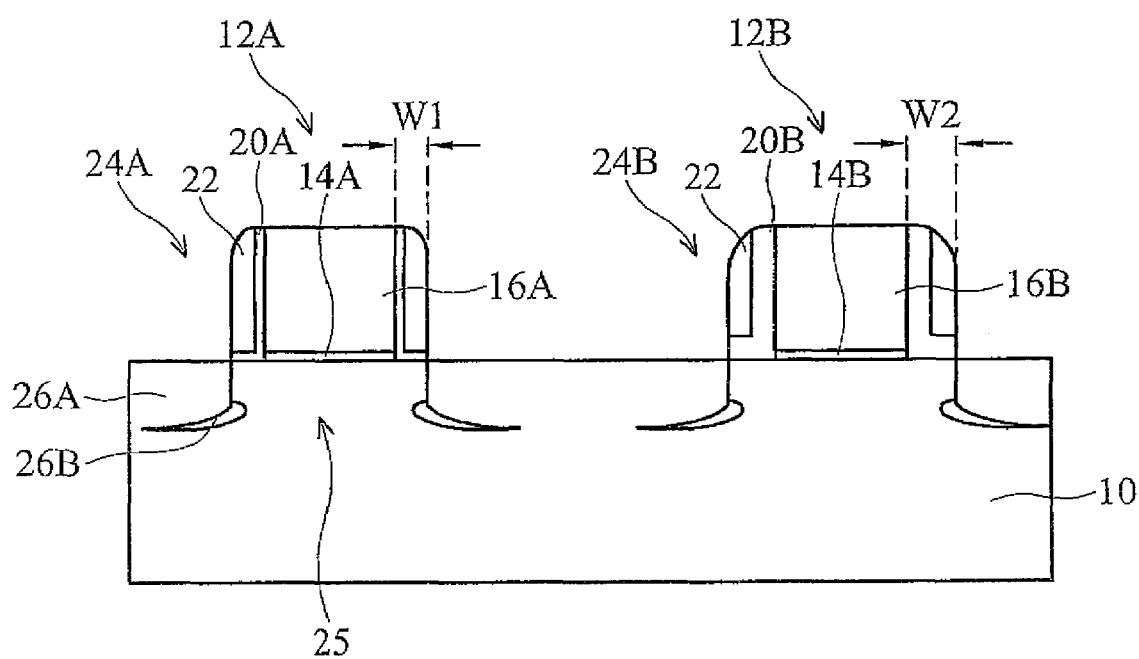

Referring to FIG. 1E, conventional dry and/or wet etching processes, are then carried out to etch back the dielectric layer 22 and oxide layer portions, 20A and 20B, to form composite oxide/nitride offset spacers e.g., 24A and 24B, adjacent either side of the gate structures 12A and 12B.

Still referring to FIG. 1E, the composite offset spacers e.g., 24A and 24B, are formed having a differential maximum width, e.g., where gate structure 12A is preferably a MOSFET making up a portion of a digital circuit and gate structure 12B is preferably a MOSFET making up a portion of an analog circuit. For example, offset spacer 24A is formed having a maximum width W1 relatively thinner compared to a maximum width W2 of offset spacer 24B. Preferably, the offset spacer 24A is formed having a maximum width W1 being from about 5 Angstroms to about 30 Angstroms thinner compared to offset spacer 24B maximum width W2.

Still referring to FIG. 1E, ion implant processes such as an LDD ion implant and/or pocket (halo) implant are carried out with the offset spacers 24A and 24B determining the location and spacing of doped regions formed in the semiconductor substrate including LDD regions e.g., 26A and/or pocket implant regions e.g., 26B. It will be appreciated that the ion implant process may be carried out an angle to better locate the LDD and or pocket implant interfaces with respect to a channel region e.g., 25, underlying the gate structures. It will additionally be appreciated that the MOSFET devices formed comprising the differential width offset spacers form MOSFET devices having operationally distinguishable characteristics, e.g., drive current, Voltage threshold ($V_T$), short channel effects (SCE), and the like.

It will be appreciated that gate structure 12B may include a relatively larger gate length (Lg), e.g., an analog MOSFET device compared to a shorter gate length (Lg) for gate structure 12A, e.g., a digital MOSFET device.

It will also be appreciated that the method of the present invention may be used to form CMOS devices on a single chip having multiple widths as well as the dual width offset spacer (analog/digital) CMOS devices shown in the exemplary embodiment.

It will additionally be appreciated that the dual offset spacer widths may be used to form logic and SRAM devices, for example the relatively thicker offset spacer width forming a portion of SRAM transistors and the relatively thinner offset spacer widths forming a portion of logic transistors. In addition, dual spacer widths may be used to form an NMOS SRAM cell transistor (relatively thicker offset spacer width) and a PMOS SRAM cell transistor (relatively thinner offset spacer width).

Figure 2:
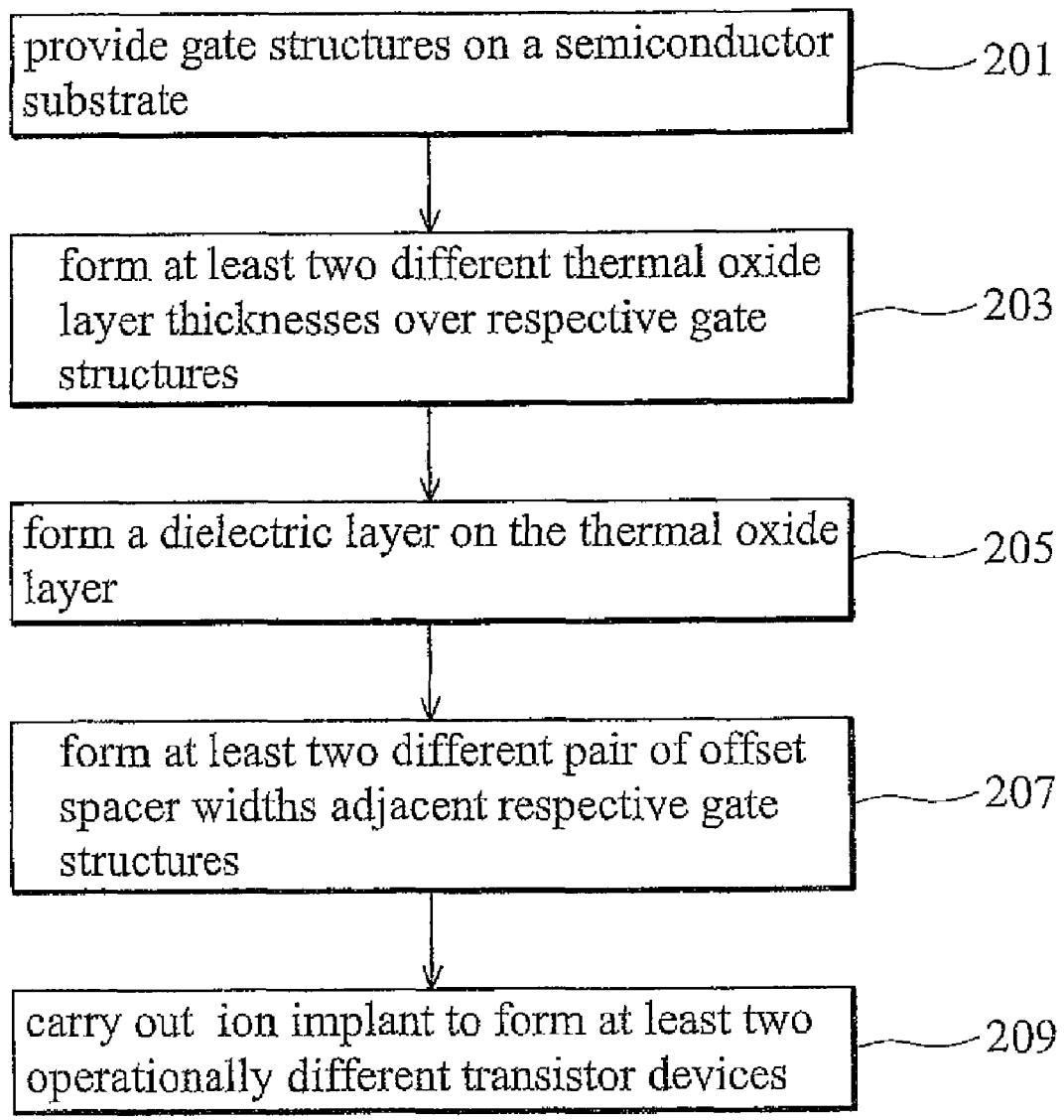
FIG. 2 is a process flow diagram including several embodiments of the present invention.

Referring to FIG. 2, is shown a process flow diagram including several embodiments of the present invention. In process 201, gate structures are provided on a semiconductor substrate. In process 203, a thermally grown oxide layer is formed over the gate structures and adjacent substrate portions to form at least two different thermal oxide layer thicknesses over respective gate structures. In process 205, a dielectric layer with an etching selectivity with respect to the thermal oxide layer is formed on the thermal oxide layer. In process 207, etching processes are carried to form at least two different pair of offset spacers and associated respective maximum widths adjacent respective gate structures. In process 209, ion implant processes are carried out to form doped regions adjacent the offset spacers to form at least two operationally different transistor devices.

Thus, MOSFET devices having differentially wide offset spacers and associated ion implanted (doped) regions forming operationally distinguishable devices and a method for forming the same has been presented such that a cost effective way for forming respective ion implants to form doped regions adjacent gate structures can be accomplished with a minimal number of steps and be optimized for formation of different MOSFET devices in parallel. For example, analog/digital, logic/SRAM, and SRAM PMOS/NMOS MOSFET devices may be formed in parallel processes with a reduced number of processing steps on a single chip, including in a system on chip (SOC) implementation. Advantageously, analog devices having a thicker offset spacer width may be formed with doped regions optimized for Voltage threshold matching and Voltage gain while the thinner offset spacer width may be formed with doped regions being optimized for reducing SCE effects and increasing drive current.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. MOSFET gate structures comprising:
a first gate structure and a second gate structure formed on a semiconductor substrate;
a pair of first offset spacers formed adjacent either side of the first gate structure, each of the first offset spacers comprising a first silicon oxide layer and a first dielectric layer overlying the first silicon oxide layer;
a pair of second offset spacers formed adjacent either side of the second gate structure, each of the second offset spacers comprising a second silicon oxide layer and a second dielectric layer overlying the second silicon oxide layer; and
ion implanted doped regions formed in the semiconductor substrate adjacent the first offset spacers and the second offset spacers respectively to form a first MOSFET device and a second MOSFET device;
wherein, a maximum width of each of the first offset spacers is different from a maximum width of each of the second offset spacers, and the first silicon oxide layer is thinner than the second silicon oxide layer, and
wherein the first silicon oxide layer and the second silicon oxide layer are formed on the underlying first gate structure and second gate structure respectively, and at least one of the first gate structure and the second gate structure is doped with a dopant selected from the group consisting of nitrogen and fluorine ions.

2. The MOSFET gate structures of claim 1, wherein the first silicon oxide layer and the second silicon oxide layer are thermally grown on the underlying first gate structure and second gate structure respectively.

3. The MOSFET gate structures of claim 1, wherein the second silicon oxide layer has a thickness from about 20 Angstroms to about 80 Angstroms.

4. The MOSFET gate structures of claim 1, the first silicon oxide layer has a thickness from about 10 Angstroms to about 50 Angstroms.

5. The MOSFET gate structures of claim 1, wherein the first MOSFET device having the first offset spacers is a digital MOSFET device and the second MOSFET device having the second offset spacers is an analog MOSFET device.

6. The MOSFET gate structures of claim 1, wherein the first MOSFET device having the first offset spacers is a logic MOSFET device and the second MOSFET device having the second offset spacers is an SRAM MOSFET device.

7. The MOSFET gate structures of claim 1, wherein the first MOSFET device having the first offset spacers is a PMOS SRAM cell MOSFET device and the second MOSFET device having the second offset spacers is a NMOS SRAM cell MOSFET device.

8. The MOSFET gate structures of claim 1, wherein the first MOSFET device having the first offset spacers comprises a relatively shorter gate length and the second MOSFET device having the second offset spacers comprises a relatively longer gate length.

9. The MOSFET gate structures of claim 1, wherein the differential thickness between each of the first offset spacers and each of the second offset spacers is from about 5 Angstroms to about 30 Angstroms.

10. The MOSFET gate structures of claim 1, wherein the dielectric layer comprises a material selected from the group consisting of silicon nitride and silicon oxynitride.

11. The MOSFET gate structures of claim 1, wherein the doped regions are selected from the group consisting of LDD and pocket implant regions.

* * * * *